United States Patent [19]
Hattori

[11] Patent Number: 5,459,424
[45] Date of Patent: Oct. 17, 1995

[54] CMOS PULSE DELAY CIRCUIT

[75] Inventor: Shinji Hattori, Higashi-Osaka, Japan

[73] Assignee: Sharp Kabushiki Kaisha, Osaka, Japan

[21] Appl. No.: 94,352

[22] Filed: Jul. 21, 1993

[30]   Foreign Application Priority Data

Aug. 7, 1992 [JP] Japan .................................. 4-211314

[51] Int. Cl.[6] .................................................. H03K 5/159
[52] U.S. Cl. .................................................. 327/278; 327/288
[58] Field of Search ................................. 307/601, 602,
307/603, 605, 585, 451, 571, 572, 573,
594, 595, 597, 576; 328/55; 377/76

[56]   References Cited

U.S. PATENT DOCUMENTS

| | | | |
|---|---|---|---|
| 4,514,647 | 4/1985 | Shoji | 307/603 |
| 4,899,071 | 2/1990 | Morales | 207/605 |
| 4,922,141 | 5/1990 | Lofgren et al. | 307/603 |
| 5,051,630 | 9/1991 | Logan et al. | 307/603 |
| 5,159,205 | 10/1992 | Gorecki et al. | 307/601 |
| 5,231,319 | 7/1993 | Crafts et al. | 307/603 |
| 5,239,213 | 8/1993 | Norman et al. | 307/603 |
| 5,287,025 | 2/1994 | Nishimichi | 307/603 |

FOREIGN PATENT DOCUMENTS 60-137122 7/1985 Japan .

*Primary Examiner*—Timothy P. Callahan
*Assistant Examiner*—My-Trang Nu Ton

[57]   ABSTRACT

A CMOS pulse delay circuit is arranged to accurately delay an input pulse signal by a predetermined period. The CMOS pulse delay circuit provides two inverters for causing delays. The inverters each have switching transistors. The switching transistors of the first inverter are associated with voltage-controllable variable resistance elements located in series to each other for varying the on-resistance of the transistors. The varying of the on-resistance results in keeping the output delay phases accurate.

10 Claims, 5 Drawing Sheets

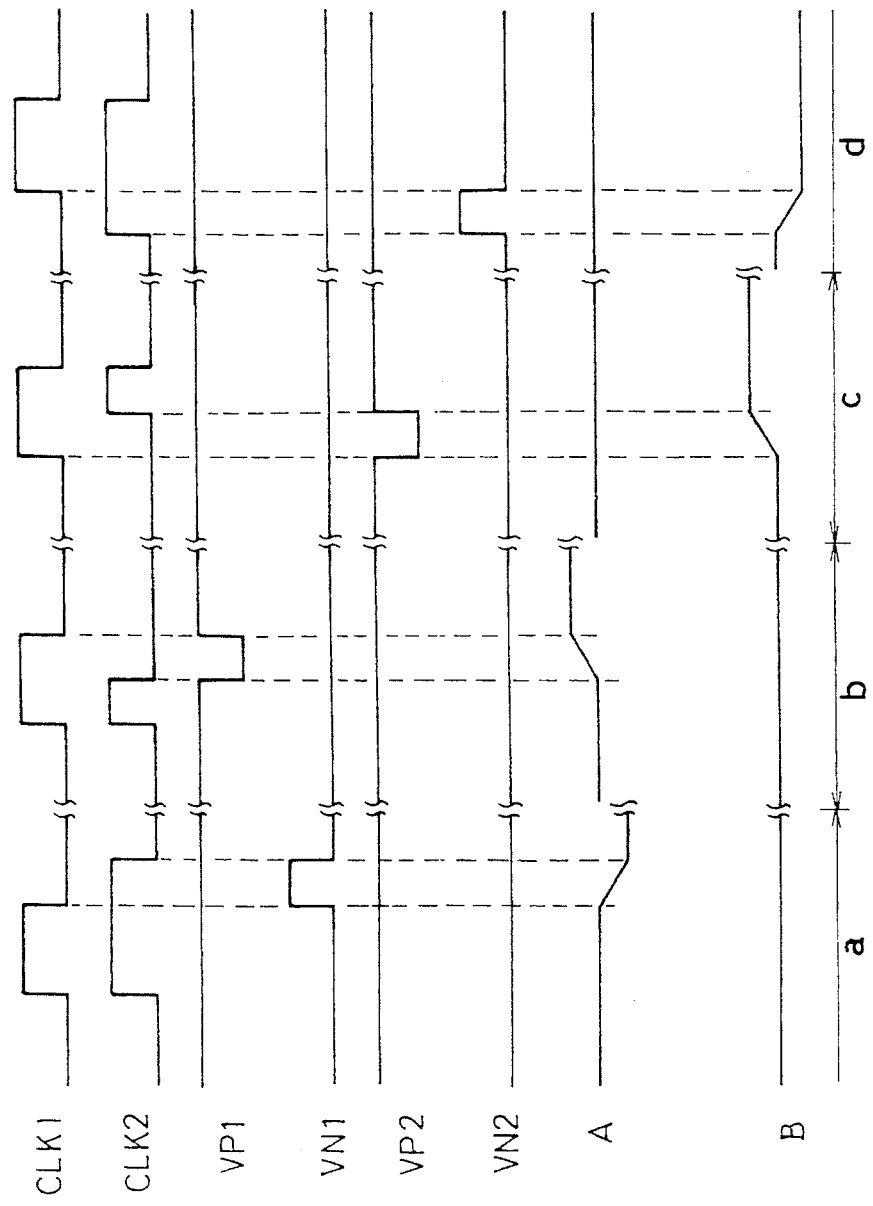

CMOS PULSE DELAY CIRCUIT

BACKGROUND OF THE INVENTION

1. Field of the Invention

The present invention relates to a CMOS pulse delay circuit which is used widely in a digital CMOS integrated circuit, and more particularly to the CMOS pulse delay circuit which may be suitable to a high-speed clock generator and a clock generating circuit to which the CMOS pulse delay circuit applies.

2. Description of the Related Art

The inventors of the present application know a pulse delay circuit which is arranged to have a MOS capacitor connected to an output of a CMOS inverter at the first stage. Then, the description will be oriented to the operating principle of the known pulse delay circuit as referring to FIG. 1.

As shown in FIG. 1, the known delay circuit includes a first inverter 21 and a second inverter 22 connected to an output of the first inverter 21. The first inverter 21 is arranged to have a p-type MOS transistor 23 and an n-type MOS transistor 24, the drains of which are connected to each other. The input of the delay circuit is fed to the gates of the p-type MOS transistor 23 and the n-type MOS transistor 24. The contact of the drains serves as an output of the inverter 21.

The second inverter 22 is, likewise, arranged to have a p-type MOS transistor 25 and an n-type MOS transistor 26, the drains of which are connected to each other. The output of the first inverter 21 is fed to the gates of the p-type MOS transistor 25 and the n-type MOS transistor 26. The contact of the drains serves as an output of the delay circuit.

The output of the first inverter 21 is connected to a p-type MOS capacitor 27 and an n-type MOS capacitor 28. That is, at the output of the first inverter 21, there exists as capacitance the p-type MOS capacitor 27, the n-type MOS capacitor 28, and the gate capacitances of the p-type MOS transistor 25 and the n-type MOS transistor 26 composing the second inverter 22.

When the input of the inverter 21 instantly changes from low (GND) level to high (Vcc) level, the p-type MOS transistor 23 is turned off and the n-type MOS transistor 24 is turned on, so that the output of the inverter 21 which has high-level may be connected to the ground (GND) through the effect of the on resistance of the n-type MOS transistor 24. That is, the output voltage of the inverter 21 gradually lowers through the effect of the capacitor and the on resistance. If it becomes lower than the inverted voltage of the inverter 22, the output of the inverter 22 changes from low level to high level. The resulting delay time is about 0.7 Rn C, in which Rn denotes an on resistance of the n-type MOS transistor 24, C denotes all the capacitance of the capacitors, and the inverted voltage of the inverter 22 is ½ Vcc. When the input of the inverter 21 changes from high level to low level, the similar delay may take place. The delay time is about 0.7 Rp C, in which Rp denotes an on resistance of the p-type MOS transistor 23.

In the known pulse delay circuit, however, some essential parameters for defining a delay time are variable due to some factors such as a manufacturing variety, a device temperature, and a supply voltage. The known pulse delay circuit, therefore, cannot to provide an accurate delay time. Further, the use of such a pulse delay circuit makes it quite difficult to generate phases accurately delayed by a predetermined period.

Further, the clock generator provided in a microprocessor needs to receive a high frequency clock. The frequency of the necessary clock is integer times as high as that of the output clock, because the clock generator has to generate two or more phases. This leads to an obstacle to speeding up the clock generator and a loss of power consumption.

SUMMARY OF THE INVENTION

It is, therefore, an object of the present invention to provide a pulse delay circuit which is capable of independently controlling a delay time on a leading edge and a delay time on a trailing edge of a pulse signal for the purpose of keeping a delay time accurate.

It is another object of the present invention to provide a clock generator to which the pulse delay circuit applies for generating phases accurately shifted by a predetermined period.

In carrying out the object, according to a first aspect of the invention, a CMOS pulse delay circuit having a capability of supplying an output delayed by a predetermined period than an input pulse signal, includes: inverters for causing a delay and providing two switching means; the switching means having voltage-controllable variable resistance elements located in series to each other for varying the on resistances.

According to a second aspect of the invention, a clock generating circuit having a capability of receiving a clock signal as an input and generating one or more clock signals having different phases from one another, includes: a circuit having a plurality of CMOS pulse delay circuits according to the first aspect connected in cascade for delaying the input clock signal by one period; and a control circuit for detecting a phase error difference between the input clock signal and the clock signal delayed by one period from the circuit and controlling a control voltage for applying each of the voltage controllable variable resistance elements included in the CMOS pulse delay circuit in a manner to reduce a phase error as much as possible.

In operation, the two switching means of the inverter for causing a delay provide voltage-controllable variable resistance elements (resistor) for varying on resistances according to the control voltage applied to the resistance elements. The delay time of the delay circuit is in proportion to the on resistance. Hence, the delay time is controlled by the control voltage applied to the voltage-controllable variable resistance element. By adjusting the resistance value of the resistance element located in series to one of the two switching means, it is possible to control the delay time on the trailing edge of a clock. By adjusting the resistance value of the resistance element located in series to the other switching element, the delay time on the leading edge is controlled. The resulting pulse delay circuit, hence, is quite accurate.

In the case that such a delay circuit applies to a clock generating circuit, the control circuit operates to detect a phase error between an input clock signal and a clock signal delayed by one period. The control voltage for applying to each voltage-controllable variable resistance element is adjusted so as to reduce the phase error. The delay time at one stage of the CMOS pulse delay circuit, therefore, is just 1/an integer times one clock period. Hence, the clock generating circuit enables to feed clocks at quite accurate phases and makes contribution to lowering a clock frequency of a microprocessor if it is applied thereto.

Further objects and advantages of the present invention

BRIEF DESCRIPTION OF THE DRAWINGS

FIG. 5 is a timing chart for describing an operation of the control circuit shown in FIG. 4.

DESCRIPTION OF THE PREFERRED EMBODIMENTS

Figure 1:
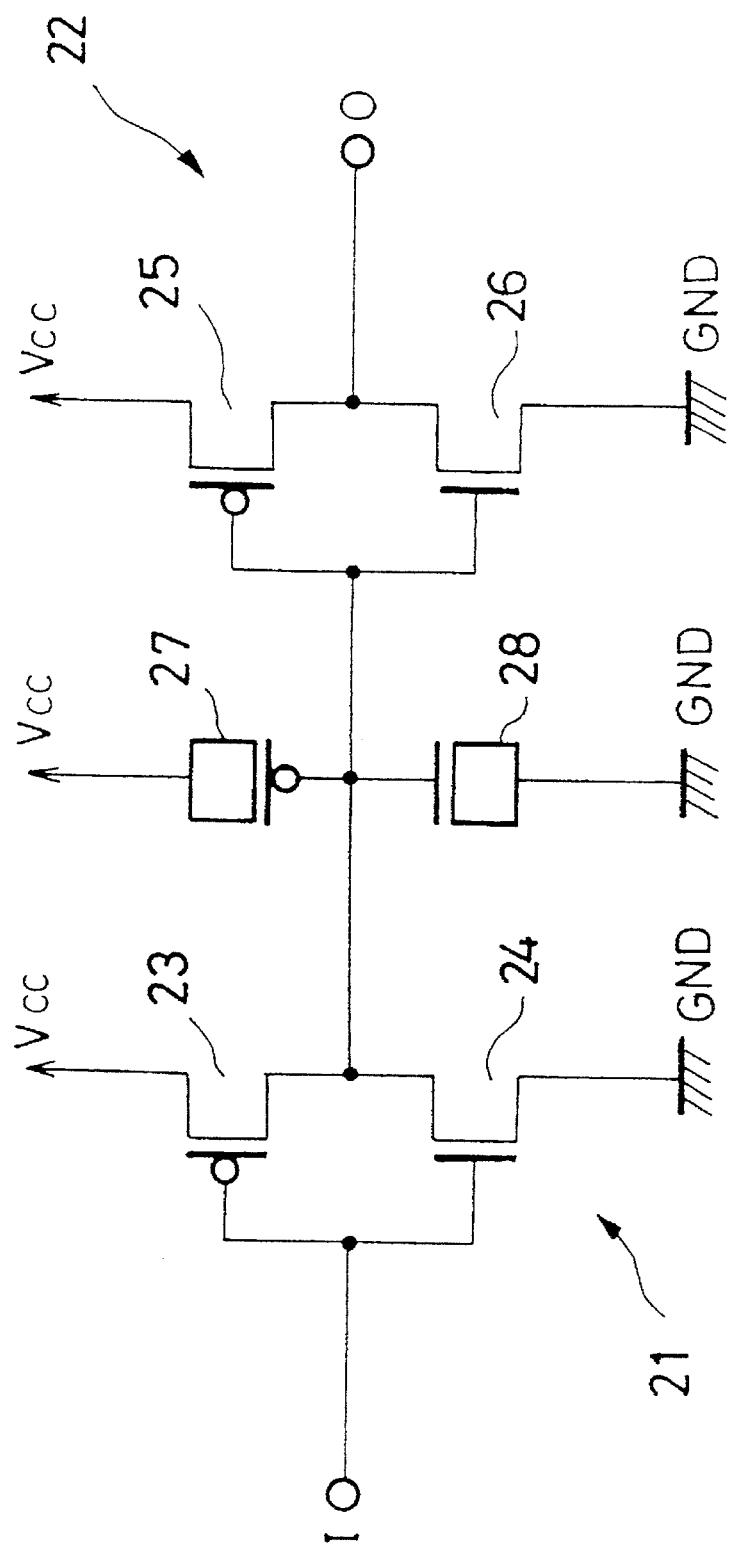
FIG. 1 is a circuit diagram showing a CMOS pulse delay circuit according to a related art of the invention.
Figure 2:
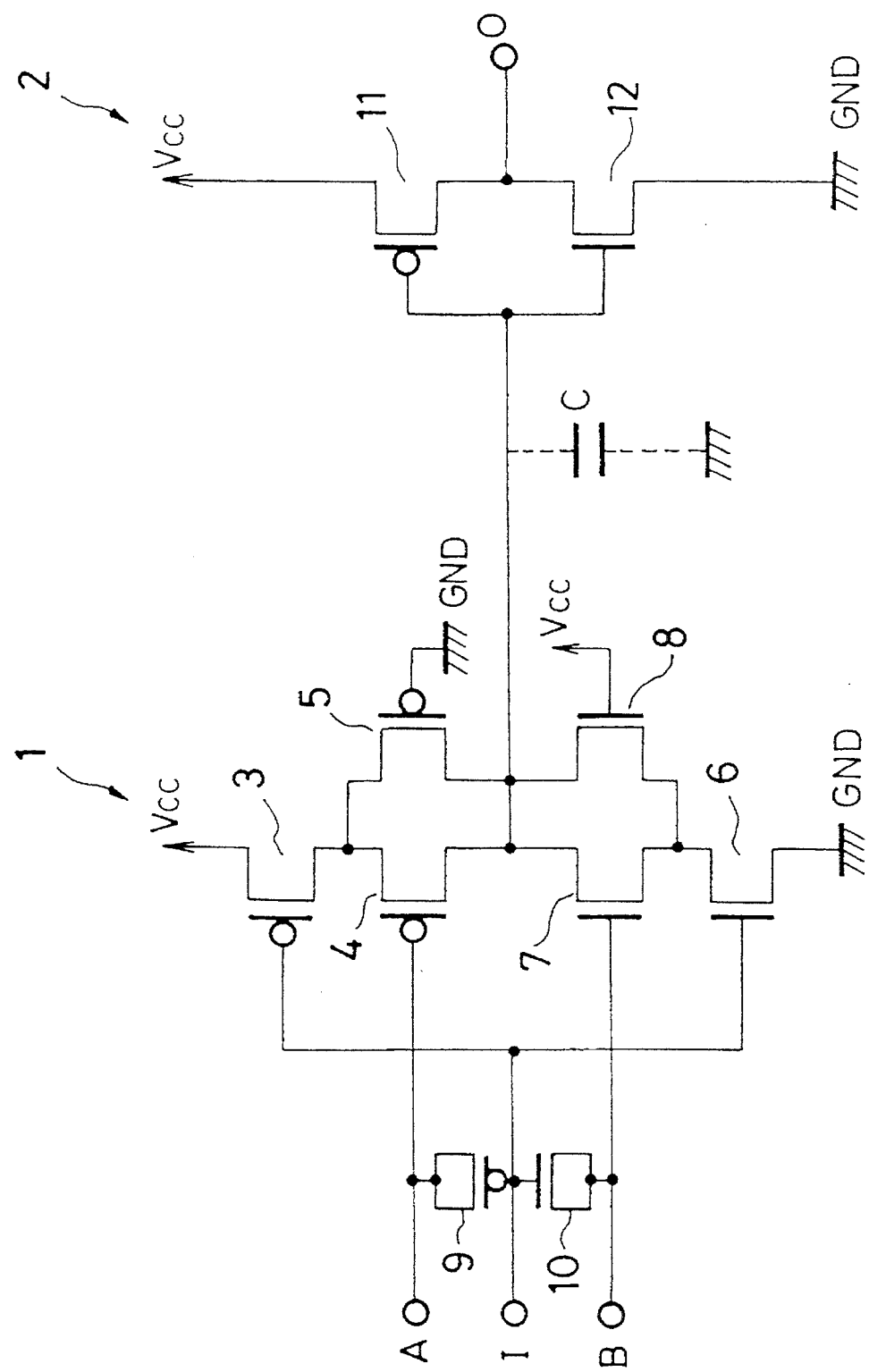
FIG. 2 is a circuit diagram showing a CMOS pulse delay circuit according to an embodiment of the present invention.

Now, the description will be oriented to a delay circuit according to an embodiment of the present invention as referring to FIG. 2. This delay circuit has a function of controlling a delay time according to a voltage applied thereon.

As shown in FIG. 2, the delay circuit provides one input terminal I, one output terminal 0, and two control terminals A and B. The delay circuit consists of an inverter 1 and the other inverter 2.

The inverter 1 is arranged to have p-type MOS switch sections 3 to 5 and n-type MOS switch sections 6 to 8. A supply voltage Vcc on the high potential side is applied to the source of the p-type MOS transistor 3. The drain of the p-type MOS transistor 3 is connected to a source of the p-type MOS transistor 4. The p-type MOS transistor 4 has a drain connected to a drain of the n-type MOS transistor 7. The n-type MOS transistor 7 has a source connected to the drain of the n-type MOS transistor 6. A contact between the drains of the p-type MOS transistor 4 and the n-type MOS transistor 7 serves as an output of the inverter 1. The p-type MOS transistor 5 is connected in parallel between the source and the drain of the p-type MOS transistor 4. The n-type MOS transistor 8 is connected in parallel between the source and the drain of the n-type MOS transistor 7. The p-type MOS transistor 4 has a gate connected to the control terminal A. The n-type MOS transistor 7 has a gate connected to the control terminal B. The p-type MOS transistor 5 has a gate connected to the ground (GND) and the n-type MOS transistor 8 has a gate connected to Vcc. The n-type MOS transistor 6 has a drain connected to the supply voltage GND on the lower potential side and the gates of the p-type MOS transistor 3 and the n-type MOS transistor 6 are connected to the input terminal I.

Between the input terminal I and the control terminal A, there is inserted a p-type MOS capacitor 9. Between the input terminal I and the control terminal B, likewise, there is inserted an n-type MOS capacitor 10.

The p-type MOS capacitor 9 and the n-type MOS capacitor 10 have a function of preventing a phenomenon that the control voltage is varied when the terminals A and B are kept at high impedance. The cause of this phenomenon is that the terminals A and B are connected to the output of the inverter 1 through the effect of the gate-drain capacitance of the p-type MOS transistor 4 and the n-type MOS transistor 7.

The p-type MOS capacitor 9 is equal in size to the p-type MOS transistor 4 and the n-type MOS capacitor 10 is equal in size to the n-type MOS transistor 7. When the terminals A and B are constantly driven at low impedance, the p-type MOS capacitor 9 and the n-type MOS capacitor 10 are not required.

In the aforementioned arrangement, the on resistance of the p-type MOS switch section may be variable according to a voltage applied onto the terminal A. At a time, the on resistance of the n-type MOS switch section may be also variable according to a voltage applied onto the terminal B.

The p-type MOS transistor 3 and the n-type MOS transistor 6 have a switching function in response to an input signal. The p-type MOS transistor 4 and the n-type MOS transistor 7 serve as a voltage-controllable variable resistor. The p-type MOS transistor 5 and the n-type MOS transistor 8 serve as a constant resistor.

Though the p-type MOS transistor 5 and the n-type MOS transistor 8 are not inevitably required, those transistors 5 and 8 are provided for limiting a maximum value of an on resistance, because an input signal is not transferred when such a voltage as switching off the p-type MOS transistor 4 and the n-type MOS transistor 7 is applied on the terminals A and B.

The inverter 2 consists of a p-type MOS transistor 11 and an n-type MOS transistor 12. A voltage Vcc is applied onto a source of the p-type MOS transistor 11, the drain of which is connected to a drain of the n-type MOS transistor 12. The n-type MOS transistor 12 has a source connected to the ground GND. The gates of the p-type MOS transistor 11 and the n-type MOS transistor 12 are connected to the output of the inverter 1, that is, a contact between the drains of the p-type MOS transistor 4 and the n-type MOS transistor 7. The contact between the drains of the p-type MOS transistor 4 and the n-type MOS transistor 7 serves as an output of the inverter 2, which is connected to the output terminal O of the delay circuit.

The output of the inverter 1 is connected to the inverter 2 so that the output of the inverter 1 may have the gate capacitances of the p-type MOS transistor 11 and the n-type MOS transistor 12 and a capacitor C composed of an output capacitance of the inverter 1 itself. If a larger capacitance is required, the conventional MOS capacitor may be connected thereto.

The inverter 2 has a function of shaping an acute waveform with a center of a medium voltage of the waveform gradually changing according to the on resistance of the inverter 1 and the capacitor C. To shape a more acute waveform, it is possible to add an even number of inverters to the output of the inverter 2.

In the aforementioned arrangement, when the input applied onto the input terminal instantly changes from low level to high level, the p-type MOS transistor 3 is switched off and the n-type MOS transistor 6 is switched on. The high-level output of the inverter 1 is connected to the ground (GND) through the effect of the on resistance of the n-type MOS transistors 7 and 6 served as voltage-controllable variable resistors. The resistance given by the n-type MOS transistor 7 depends on the control voltage applied to the gate of the transistor 7 itself so that the resistance may be any value within the on resistance by changing the control voltage. At this time, the on resistance of the inverter 1 becomes a sum of the resistance given by the n-type MOS transistor 7 and the on resistance of the n-type MOS transistor 6. It means that the on resistance of the inverter 1 may be variable depending on the control voltage applied to the control terminal B.

The output voltage of the inverter 1 is gradually lowering through the effect of the on resistance of the inverter 1 and the capacitor. When the output voltage of the inverter 1 is lower than the inverted voltage of the inverter 2, the output of the inverter 2 changes from low level to high level.

The delay time occurring at the change is about 0.7Rn'C, where Rn' denotes an on resistance of the inverter 1, C denotes the overall capacitance value of the capacitor and the inverted voltage of the inverter 2 is ½ Vcc. The delay time is in proportion to the on resistance Rn'. By changing the control voltage applied to the control terminal B, therefore, the delay amount on the leading edge of a pulse is allowed to be controlled. In this case, the increase of the control voltage causes the resistance of the n-type MOS transistor 7 to be reduced, thereby decreasing the delay amount. On the other hand, the decrease of the control voltage causes the resistance of the n-type MOS transistor 7 to be increased, thereby increasing the delay amount on the leading edge.

When the input signal applied to the input terminal instantly changes from high level to low level, the p-type MOS transistor 3 is switched on and the n-type MOS transistor 6 is switched off, so that the low-level output of the inverter 1 may be connected to Vcc through the effect of the on resistances of the p-type MOS transistors 3 and 4 served as voltage-controllable variable resistors. The resistance value of the p-type MOS transistor 4 depends on the control voltage applied to the gate and may be any value within the on resistance of the p-type MOS transistor 4. The on resistance of the inverter 1 is a sum of a resistance of the p-type MOS transistor 4 and an on resistance of the p-type MOS transistor 3. It means that the on resistance of the inverter 1 may change on the control voltage applied to the control terminal A.

The output voltage of the inverter 1 gradually rises through the effect of the capacitor and the on resistance of the inverter 1. When it becomes higher than the inverted voltage of the inverter 2, the output of the inverter 2 changes from high level to low level.

The delay time caused at the change is about 0.7 Rp'C, wherein Rp' denotes an on resistance of the inverter, C denotes an overall capacitance of the capacitor, and the inverted voltage of the inverter 2 is ½ Vcc. The delay time is in proportion to the on resistance Rp'. By changing the control voltage applied to the control terminal A, therefore, the delay amount on the trailing edge is allowed to be controlled. In this case, the decrease of the control voltage causes the resistance of the p-type MOS transistor 4 to be decreased, thereby decreasing the delay amount. On the other hand, the increase of the control voltage causes the resistance of the p-type MOS transistor 4 to be increased, thereby increasing the delay amount on the trailing edge.

As set forth above, the CMOS pulse delay circuit according to this embodiment is capable of independently controlling a delay time on a leading edge and a delay time on a trailing edge of the pulse signal. This results in making it possible for the delay circuit to obtain a more accurate delay time.

Figure 3:
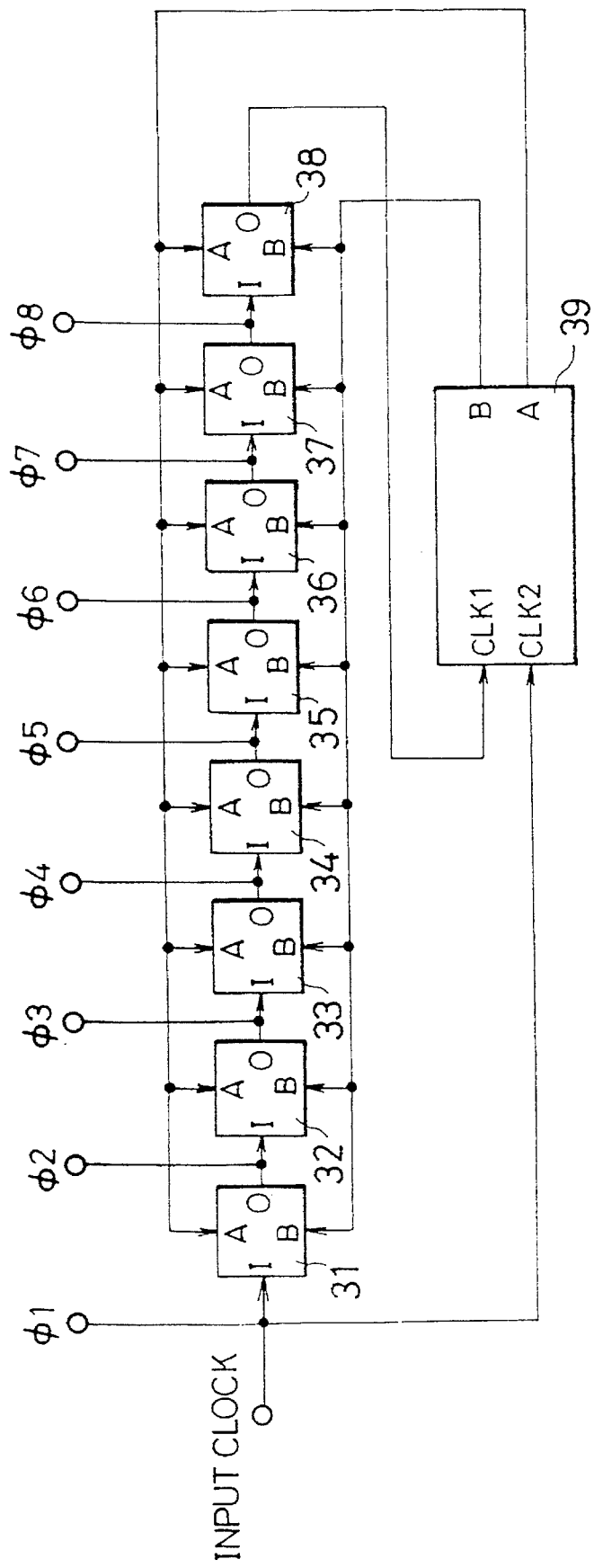
FIG. 3 is a circuit diagram showing a clock generating circuit according to an embodiment of the present invention.

Next, the description will be oriented to an embodiment of a clock generating circuit to which the delay circuit of the above-mentioned embodiment applies as referring to FIG. 3. In FIG. 3, numerals 31 to 38 denote delay circuits shown in FIG. 2, each of which provides the input terminal I, the output terminal O and the control terminals A and B.

Figure 4:
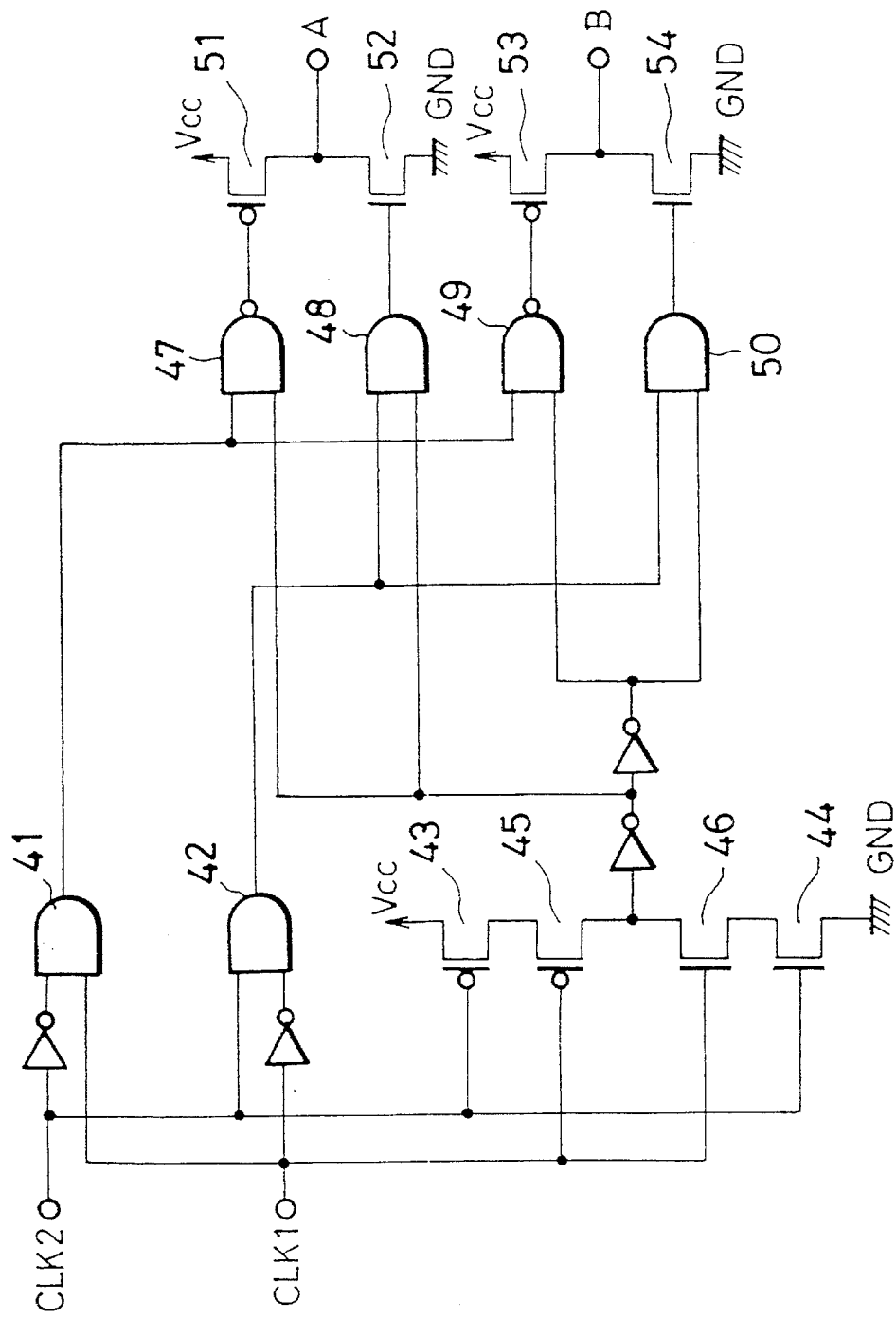
FIG. 4 is a circuit diagram showing a control circuit included in the clock generating circuit shown in FIG. 3.

The eight delay circuits 31 to 38 enable to offer a delay time matching to just one period of the input clock. At the input terminal I of the delay circuit 31 at the first stage, an input clock is fed. At each of the input terminals of the delay circuits 31 to 38 at the second to the eighth stages, the output of the delay circuit at the one previous stage is fed. The output of the delay circuit 38 at the final (eighth) stage is fed to the input of the CLK 1 of a control circuit 39. At the input of the CLK 2, an input clock is fed. An example of the control circuit 39 is shown in FIG. 4. The control circuit 39 provides two outputs A and B, the output A being connected to the control terminal A of the delay circuits 31 to 38 and the output B being likewise connected to the control terminal B. The control circuit 39 operates to detect a phase error between the input clock and the clock delayed by one period and increase or decrease the voltage supplied on the control terminals A and B of the delay circuits 31 to 38 in a manner to reduce the detected error.

Then, the arrangement and the operation of the control circuit 39 will be discussed as referring to FIG. 4. The control circuit 39 provides two two-input AND circuits 41 and 42. The two-input AND circuit 41 is arranged to receive a signal to be applied to the input of the CLK 1 and an inverted one of the signal to be applied to the input of the CLK 2. The other two-input AND circuit 42 is arranged to receive a signal to be applied to the input of the CLK 2 and an inverted one of the signal to be applied to the input: of the CLK 1. These two-input AND circuits 41 and 42 operate to detect a phase error.

The control circuit 9 provides a p-type MOS transistor 43, an n-type MOS transistor 44, a p-type MOS transistor 45, and an n-type MOS transistor 46. The p-type MOS transistor 43 and the n-type MOS transistor 44 receive at their gates a signal to be applied to the input of the CLK 2. The p-type MOS transistor 45 and the n-type MOS transistor 46 receive at their gates a signal to be applied to the input of the CLK 1. The source of the p-type MOS transistor 43 is connected to Vcc and the drain of the p-type MOS transistor 43 is connected to a source of the p-type MOS transistor 45. The p-type MOS transistor 45 has a drain connected to a drain of the n-type MOS transistor 46. The n-type MOS transistor 46 has a source connected to a drain of the n-type MOS transistor 44. The n-type MOS transistor 44 has a source connected to the ground (GND). These MOS transistors 43 to 46 operate to detect a delay error on a trailing edge or a delay error on a leading edge. That is, they serve to select any one of the output terminals A and B.

The control circuit 39 further provides NAND circuits 47 and 49 and AND circuits 48 and 50. The NAND circuit 47 receives an output sent from the AND circuit 41 and an inverted one (first inverted signal) of a signal on the contact between the drains of the p-type MOS transistor 11 and the n-type MOS transistor 12. The AND circuit 48 receives an output sent from the AND circuit 42 and the first inverted signal. The NAND circuit 49 receives an output from the AND circuit 41 and an inverted one (second inverted signal) of the first inverted signal. The AND circuit 50 receives an output from the AND circuit 42 and the second inverted signal. These NAND circuits 47, 49 and the AND circuits 48, 50 operate to generate a pulse according to the delay amount on the leading edge or the delay amount on the trailing edge of a clock.

The output (VP1) of the NAND circuit 47 is applied to the gate of the p-type MOS transistor 51. The output (VN1) of the AND circuit 48 is applied to the n-type MOS transistor 52. The p-type MOS transistor lhas a source connected to Vcc and a drain connected to a drain of the n-type MOS transistor 52. The n-type MOS transistor has a source connected to the ground (GND). A contact between the drains of the p-type MOS transistor 51 and the n-type MOS transistor 52 is connected to the output terminal A.

The output (VP2) of the NAND circuit 49 is applied to the gate of the p-type MOS transistor 53. The output (VN2) of the AND circuit 50 is applied to the n-type MOS transistor 54. The p-type MOS transistor 53 has a source connected to Vcc and a drain connected to the drain of the n-type MOS transistor 54. The n-type MOS transistor 53 has a source connected to the ground (GND). A contact between the drains of the p-type MOS transistor 53 and the n-type MOS transistor 54 is connected to the output terminal B.

FIG. 5 is a timing chart for describing the operation of the control circuit shown in FIG. 4.

The period "a" in FIG. 5 shows how the control circuit operates when a delay on the trailing edge of a clock is larger than one clock period. In the error portion, the output from the AND circuit 41 is low, the output from the AND circuit 42 is high, and the first inverted output is high. Hence, the pulse generated in an internal signal VN1 is a positive pulse having a width proportional to the error. This pulse serves to turn on the n-type MOS transistor 52, thereby lowering the voltage at the terminal A. As a result of lowering the voltage at the terminal A, the resistance of the p-type MOS transistor 4 included in each delay circuit is made smaller. This results in reducing the delay amount and, as a whole, solving the delay error on the trailing edge of a clock.

The period "b" in FIG. 5 shows how the control circuit operates when a delay on the trailing edge of a clock is smaller than one clock period. In the error portion, the output from the AND circuit 41 is high, the output from the AND circuit 42 is low, and the first inverted output is high. Hence, the pulse generated in an internal signal VP1 is a negative pulse having a width proportional to the error. The pulse serves to turn on the p-type MOS transistor 51, thereby boosting the voltage at the terminal A. The rise of the voltage at the terminal A leads to increase of the resistance of the p-type MOS transistor 4 included in each delay circuit. As a result, the delay amount is increased and as a whole, the delay error on the trailing edge of a clock is solved.

At the portion where a clock signal and another clock signal delayed by one period are both high or low, the outputs from the AND circuits 41 and 42 are both low. Hence, no pulse takes place in the internal signals VP1 and VN1 (VP1 is high and VN1 is low). As a result, both of the p-type MOS transistor 11 and the n-type MOS transistor 12 are switched off, which keeps the terminal A at high impedance, thereby maintaining a current voltage at the terminal A.

The period "c" in FIG. 5 shows how the control circuit operates when the delay on the leading edge of a clock is larger than one clock period. In this error portion, the output from the AND circuit 41 is low, the output from the AND circuit 42 is high, and the second inverted output is high. Hence, the pulse generated in an internal signal VP2 is a negative pulse having a width proportional to the error. This pulse serves to switch on the p-type MOS transistor 53, thereby boosting the voltage at the terminal B. The rise of the voltage at the terminal B causes the resistance of the n-type MOS transistor 7 included in each delay circuit to be reduced. The reduction results in decreasing the delay amount and, as a whole, solving the delay error on the leading edge of a clock.

The period "d" in FIG. 5 shows how the control circuit operates when the delay on the leading edge of a clock is smaller than one clock period. In the error portion, the output from the AND circuit 41 is high, the output from the AND circuit 42 is low, and the second inverted output is high. Hence, the pulse generated in the internal signal VN2 is a positive pulse having a width proportional to the error. This pulse serves to switch on the n-type CMOS transistor 54, thereby lowering the voltage at the terminal B. The lowering of the voltage at the terminal B causes the resistance of the n-type MOS transistor 7 included in each delay circuit to be increased. This increase results in decreasing the delay amount and, as a whole, solving a delay error on the leading edge of a clock.

In the portion where a clock signal and another clock signal delayed by one period are both high or low, the outputs from the AND circuits 41 and 42 are both low. Hence, no pulse is generated in the internal signals VP2 and VN2 (VP2 is high and VN2 is low). As a result, both of the p-type MOS transistor 53 and the n-type MOS transistor 54 are switched off, which keeps the terminal B at high impedance, thereby maintaining the voltage at the terminal B.

As set forth above, the input clock and the clock delayed by one period are automatically matched in phase to each other. The phases of the output clocks φ1 to φ8 are precisely divided by a factor of 8, that is, shifted respectively by the same period.

The pulse generating circuit according to this embodiment, therefore, is capable of precisely generating clock phases.

Many widely different embodiments of the present invention may be constructed without departing from the spirit and scope of the present invention. Such variations are not to be regarded as departure from the spirit of scope of the invention, and all such modifications would be obvious to one skilled in the art are intended to be included within the scope of the following claims:

What is claimed is:

1. A CMOS pulse delay circuit having a capability of supplying an output signal delayed by a predetermined period from an input pulse signal, comprising:

a first inverter for causing a delay, including a first p-type MOS transistor having a source to which a supply voltage is applied, a drain and a gate and a first n-type MOS transistor having a source connected to ground, a drain and a gate;

voltage-controllable variable resistance elements including a second p-type MOS transistor for varying an on-resistance of said first p-type MOS transistor to control a delay amount of a trailing edge of a pulse, having a source connected to said drain of said first p-type MOS transistor, a drain and a gate to which a first control voltage is applied and a second n-type MOS transistor for varying an on-resistance of said first n-type MOS transistor to control a delay amount of a leading edge of a pulse, having a source connected to said drain of said first n-type MOS transistor, a drain connected to said drain of said second p-type MOS transistor and a gate to which a second control voltage is applied, said first control voltage applied to said gate of said second p-type MOS transistor and said second control voltage applied to said gate of said second n-type MOS transistor being independently changed for independent control of said delay amount of said trailing edge and said leading edge of pulses;

a third p-type MOS transistor connected in parallel with said second p-type MOS transistor, a gate of said third p-type MOS transistor being connected to the ground; and a third n-type MOS transistor connected in parallel with said second n-type MOS transistor, a gate of said third n-type MOS transistor being connected to the supply voltage.

2. A CMOS pulse delay circuit according to claim 1, wherein said delay circuit has one input terminal connected to the gates of said first p-type and n-type MOS transistors, and a first and second control terminal connected to said gates of said second p-type and n-type MOS transistors, respectively.

3. A CMOS pulse delay circuit according to claim 2, wherein a p-type MOS capacitor is connected between said first control terminal and said one input terminal and a n-type MOS capacitor is connected between said second control terminal and said one input terminal.

4. A CMOS pulse delay circuit according to claim 1, further comprising a second inverter connected to an output of said first inverter for shaping an acute waveform.

5. A clock generating circuit having a capability of receiving a clock signal as an input and generating one or more clock signals having different phases from one another, comprising:

a circuit having a plurality of CMOS pulse delay circuits connected in cascade for delaying said input clock signal by one period, each of said CMOS pulse delay circuits including:

a first inverter for causing a delay, including a first p-type MOS transistor having a source to which a supply voltage is applied, a drain and a gate and a first n-type MOS transistor having a source connected to ground, a drain and a gate; and voltage-controllable variable resistance elements including a second p-type MOS transistor for varying an on-resistance of said first p-type MOS transistor to control a delay amount of a trailing edge of a pulse, having a source connected to said drain of said first p-type MOS transistor, a drain and a gate to which a first control voltage is applied and a second n-type MOS transistor for varying an on-resistance of said first n-type MOS transistor to control a delay amount of a leading edge of a pulse, having a source connected to said drain of said first n-type MOS transistor, a drain connected to said drain of said second p-type MOS transistor and a gate to which a second control voltage is applied, said first control voltage applied to said gate of said second p-type MOS transistor and said second control voltage applied to said gate of said second n-type MOS transistor being independently changed for independent control of said delay amount of said trailing edge and said leading edge of pulses;

a control circuit for detecting a phase error difference between said input clock signal and a clock signal delayed for one period by said circuit, and for controlling said first and second control voltages applied to said gates of said second p-type and n-type MOS transistors, respectively, in a manner to reduce said detected phase error;

a third p-type MOS transistor connected in parallel with said second p-type MOS transistor, a gate of said third p-type MOS transistor being connected to the ground; and a third n-type MOS transistor connected in parallel with said second n-type MOS transistor, a gate of said third n-type MOS transistor being connected to the supply voltage.

6. A clock generating circuit according to claim 5, wherein each CMOS pulse delay circuit has one input terminal connected to the gates of said first p-type and n-type MOS transistors, and a first and second control terminal connected to said gates of said second p-type and n-type MOS transistors, respectively.

7. A clock generating circuit according to claim 6, wherein said control circuit has a first output connected to said first control terminal of each CMOS pulse delay circuit and a second output connected to said second control terminal of each CMOS pulse delay circuit.

8. A clock generating circuit according to claim 7, wherein said control circuit includes means for detecting said phase error between said input clock signal and the delayed clock signal, means for determining as to whether a delay error is on said trailing edge or on said leading edge of a pulse to select one of said first and second outputs, and means for generating a pulse having a pulse width according to a delay amount.

9. A clock generating circuit according to claim 8, wherein said pulse generating means generates a positive pulse when a delay on the trailing edge of a pulse is larger than one clock period and generates a negative pulse when a delay on the trailing edge of a pulse is smaller than one clock period.

10. A clock generating circuit according to claim 9, wherein said pulse generating means generates a negative pulse when a delay on the leading edge of a pulse is larger than one clock period and generates a positive pulse when a delay on the leading edge of a pulse is smaller than one clock period.

* * * * *